(12) United States Patent
Xie et al.

(10) Patent No.: US 8,956,939 B2
(45) Date of Patent: Feb. 17, 2015

(54) METHOD OF MAKING A RESISTIVE RANDOM ACCESS MEMORY DEVICE

(71) Applicant: ASM International N.V., Almere (NL)

(72) Inventors: Qi Xie, Leuven (BE); Vladimir Machkaoutsan, Leuven (BE); Jan Willem Maes, Wilrijk (BE); Michael Givens, Phoenix, AZ (US); Petri Raisanen, Gilbert, AZ (US)

(73) Assignee: ASM IP Holding B.V. (NL)

( * ) Notice: Subject to any disclaimer, the term of this patent is extended or adjusted under 35 U.S.C. 154(b) by 0 days.

(21) Appl. No.: 13/872,932

(22) Filed: Apr. 29, 2013

(65) Prior Publication Data

US 2014/0322885 A1    Oct. 30, 2014

(51) Int. Cl.
*H01L 21/00* (2006.01)
*H01L 45/00* (2006.01)

(52) U.S. Cl.
CPC .................................. *H01L 45/1616* (2013.01)
USPC ............................ 438/240; 438/385; 438/785

(58) Field of Classification Search
USPC .................................. 438/785, 238, 240, 385
See application file for complete search history.

(56) References Cited

U.S. PATENT DOCUMENTS

| | | | |
|---|---|---|---|
| 6,825,135 B2 | 11/2004 | Li et al. | |
| 6,849,868 B2 | 2/2005 | Campbell | |
| 6,855,975 B2 | 2/2005 | Gilton | |
| 6,858,482 B2 | 2/2005 | Gilton | |
| 6,864,500 B2 | 3/2005 | Gilton | |
| 6,867,114 B2 | 3/2005 | Moore et al. | |
| 6,890,790 B2 | 5/2005 | Li et al. | |
| 7,183,207 B2 * | 2/2007 | Kang et al. | 438/680 |
| 8,007,865 B2 * | 8/2011 | Delabie et al. | 427/248.1 |
| 2012/0248396 A1 | 10/2012 | Ramaswamy et al. | |
| 2013/0328005 A1 * | 12/2013 | Shin et al. | 257/1 |

OTHER PUBLICATIONS

Ahn et al., "Concurrent presence of unipolar and bipolar resistive switching phenomena in pnictogen oxide $Sb_2O_5$ films", *Journal of Applied Physics*, 112, 114105 (2012).
Ahn et al., "Unipolar resistive switching characteristics of pnictogen oxide films: Case study of $Sb_2O_5$", *Journal of Applied Physics*, 112, 104105 (2012).
Peng et al., "Improvement of Resistive Switching Stability of $HfO_2$ Films with Al Doping by Atomic Layer Deposition", *Electrochemical and Solid-State Letters*, 15 (4) H88-H90 (2012).

(Continued)

*Primary Examiner* — Richard Booth
(74) *Attorney, Agent, or Firm* — Knobbe, Martens, Olson & Bear LLP

(57) ABSTRACT

A method for forming a resistive random access memory (RRAM) device is disclosed. The method comprises forming a first electrode, forming a resistive switching oxide layer comprising a metal oxide by thermal atomic layer deposition (ALD) and forming a second electrode by thermal atomic layer deposition (ALD), where the resistive switching layer is interposed between the first electrode and the second electrode. Forming the resistive switching oxide may be performed without exposing a surface of the switching oxide layer to a surface-modifying plasma treatment after depositing the metal oxide.

23 Claims, 10 Drawing Sheets

(56) References Cited

OTHER PUBLICATIONS

Lee, et al., Multi-level Switching of Triple-Layered TaOx RRAM with Excellent Reliability for Storage Class Memory, IEEE, 2012, pp. 71-72.

Chen, et al., Fully CMOS BEOL compatible $HfO_2$ RRAM cell, with low (µA) program current, strong retention and high scalability, using an optimized Plasma Enhanced Atomic Layer Deposition (PEALD) process for TiN electrode, IEEE , 2011, 3 pages, 978-1-4577-0502-1/11.

Chen, et al., Hydrogen-Induced Resistive Switching in TiN/ALD $HfO_2$/PEALD TiN RRAM Device, IEEE Electron Device Letters, Apr. 2012, vol. 33, No. 4.

Govoreanu, et al., 10×10nm$^2$ Hf/HfO$_x$ Crossbar Resistive RAM with Excellent Performance, Reliability and Low-Energy Operation, IEEE, 2011, pp. IEDM11-729-IEDM11-732.

Baek, et al., Realization of Vertical Resistive Memory (VRRAM) using cost effective 3D Process, IEEE, 2011, pp. IEDM11-737-IEDM11-740.

\* cited by examiner

METHOD OF MAKING A RESISTIVE RANDOM ACCESS MEMORY DEVICE

BACKGROUND OF THE INVENTION

1. Field of the Invention

The invention relates to the field of semiconductor processing and more particularly the manufacture of resistive random access memory.

2. Description of the Related Art

Nonvolatile memory devices are used in a variety of electronic devices such as mobile phones, smartphones, digital cameras, digital music players, tablet computers, and lap top computers, to name a few. As nonvolatile memory devices continue to shrink in size to meet an increasing need for higher device density, there is a correspondingly growing need for three dimensional arrays of memory devices as well as new memory devices that store information based on resistance change. One concept addressing these needs is three dimensional resistive random access memory arrays (3D RRAM). To meet fabrication goals and to improve performance of such memory arrays, development of processes to form 3D RRAM is on-going.

SUMMARY OF THE INVENTION

A method for forming a resistive random access memory (RRAM) device according to some embodiments comprises forming a first electrode, forming a resistive switching oxide layer comprising a metal oxide by thermal atomic layer deposition (ALD) and forming a second electrode by thermal atomic layer deposition (ALD), where the resistive switching layer is interposed between the first electrode and the second electrode. According to some embodiments, forming the resistive switching oxide is performed without exposing a surface of the switching oxide layer to surface-modifying and/or film-modifying plasma treatment after depositing the metal oxide.

A method for forming a RRAM device according to another embodiment comprises forming a first electrode comprising a metal nitride, forming a resistive switching oxide layer comprising a metal oxide by atomic layer deposition (ALD), and forming a second electrode comprising a metal nitride by atomic layer deposition (ALD), where the resistive switching layer has a first surface in contact with the first electrode and a second surface opposing the first surface in contact with the second electrode. Forming the resistive switching oxide may be performed without exposing a surface of the switching oxide layer to a surface-modifying and/or film-modifying plasma treatment after depositing the metal oxide.

DETAILED DESCRIPTION OF THE PREFERRED EMBODIMENT

Figure 1:
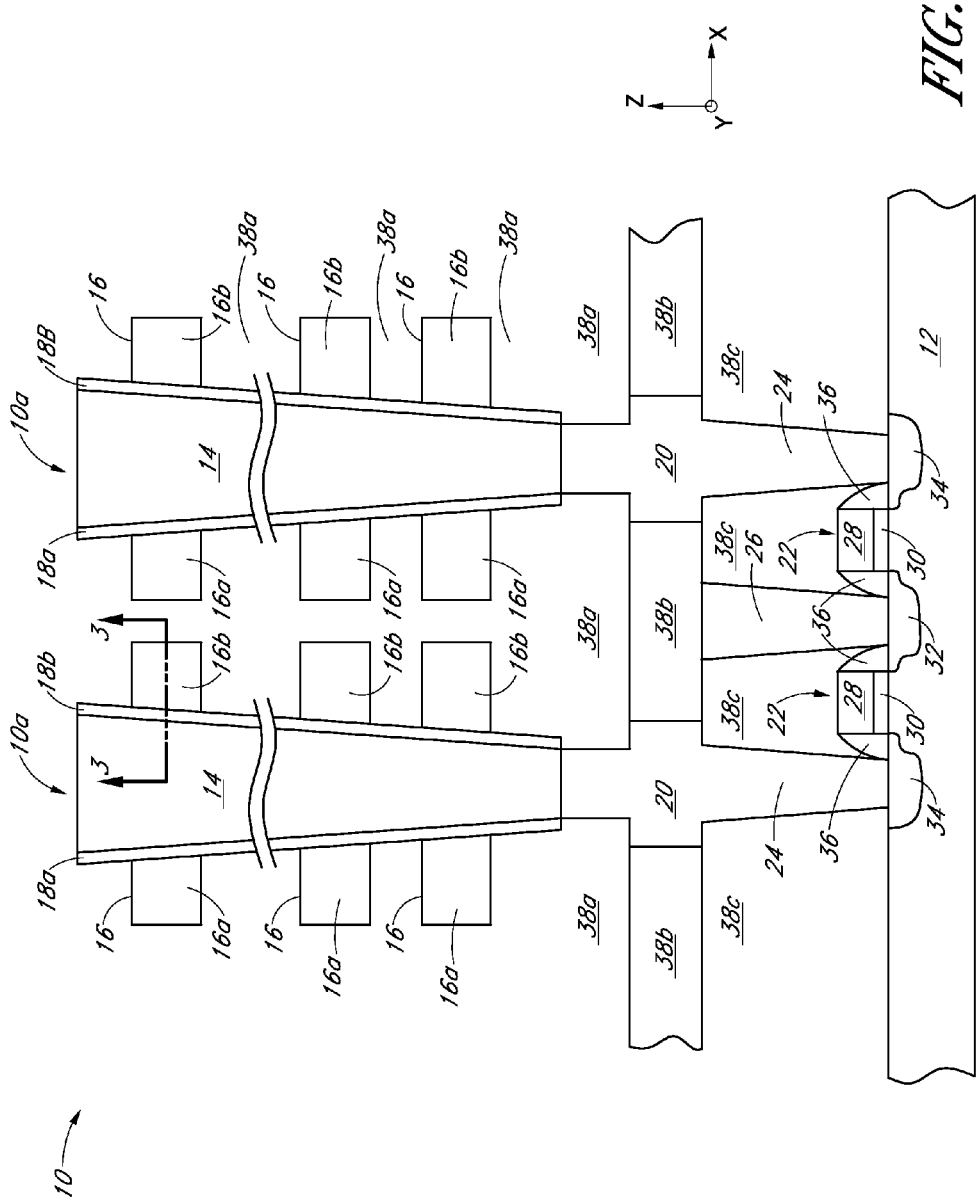
FIG. 1 is a schematic cross-sectional illustration of a 3D RRAM array according to some embodiments.

Electronic devices such as smartphones, computers, and digital cameras store large amounts of data in nonvolatile storage devices such as hard disks or solid state drives. In many mobile applications such as smart phones and mobile computers, solid state drives are often preferred over hard disks because of their compact size as well as relative immunity from reliability issues arising from motion. Solid state drives comprise, among other things, billions of dual-gate transistors called flash transistors that store charge in floating gates. The flash transistors can be arranged in various forms of array architectures. One particular array architecture known as the NAND array architecture employs flash transistors arranged in strings of 16, 32, 64, or 128 flash transistors whose channels are controlled by word lines that form control gates of the flash transistors. A NAND block can include a plurality of such strings, such as 1024, 2048, etc., where each string is connected to a bit line through a select transistor. NAND array configurations provide one of the highest number of flash transistors per unit area, making them particularly suitable for storing a high density of digital media.

The demand for higher and higher density (and also lower and lower cost) of flash transistors has resulted in continued reduction in size of the flash transistors. As the flash transistors scale below about the 20 nm node, reliability of the flash transistors degrade substantially, due to parasitic capacitive coupling between neighboring floating gates and reduction in number of stored electrons per floating gate, among other things. Two scalability concepts may be applied to allow the density of storage devices to continue to follow the trend of decreasing size and increasing density.

The first scalability concept addresses scalability at the device-level and employs storage devices based on a resistance change of a memory cell, as opposed to changes in the threshold voltage of a flash transistor. Various storage devices based on resistance change have been proposed as alternatives to flash transistors for continued scaling, including resistive-switching random access memory (RRAM). RRAM has been the focus of intense research because of its simplicity and scalability. An RRAM device can include a resistance switching layer between two electrodes. The resistance of the switching layer can be switched between a high resistance state (HRS) and a low resistance state (LRS) by application of an electrical signal.

The second scalability concept addresses scalability at the array-level and employs three-dimensional (3D) arrays. For example, in some 3D NAND array architectures, strings of 16, 32, 64, 128, etc. flash transistors extend vertically in a direction perpendicular to the surface of the silicon substrate, whose channels may be controlled by word lines forming control gates extending parallel the silicon substrate.

The first and second scalability concepts can be combined into the concept of 3D RRAM arrays, where a "string" of 16, 32, 64, 128, etc. RRAM devices may extend vertically in a direction perpendicular to the surface of the silicon substrate. In one example of a 3D RRAM array, a first set of interconnects, e.g., word lines, extend vertically in a direction perpendicular to the surface of a silicon substrate and a second set of interconnects, e.g., bit lines, extend horizontally in a direction parallel to the surface of the substrate and are configured to form cross junctions with the word lines. A resistive switching oxide layer is disposed between the word lines and the bit lines at the cross junctions to form RRAM cells such that when an electrical signal is applied across them, the RRAM cells can reversibly switch between LRS and HRS.

Such 3D RRAM arrays are often fabricated over supporting circuitry such as drivers and charge pumps to decrease the overall footprint on the substrate. As a result, there may be temperature constraints of processes used to fabricate the 3D RRAM arrays. Plasma-enhanced processes such as plasma-enhanced atomic layer deposition (PE-ALD) can lower the deposition temperature of some deposition processes. However, various process integration approaches of such 3D RRAM arrays require conformal deposition of different films such as electrode films and resistive switching materials on surfaces of vias and cavities having very high aspect ratios. Due to the need for a sheath in some cases, plasma processes may not be effective in depositing inside these types of topographies. As a result, there is a need for low temperature and conformal deposition techniques such as thermal atomic layer deposition for forming various films of the 3D RRAM arrays.

A three-dimensional resistive random access memory (3D RRAM) array according to some embodiments includes a plurality of sub-arrays disposed adjacent to one another in a x-direction. Each sub-array may include a plurality of first electrode lines stacked vertically in a z-direction and extending horizontally in a y-direction. Each sub-array may further include a plurality of second electrode lines extending vertically in the z-direction. Each of the second electrode lines may traverse at least one first electrode line and form at least one cross-point junction with one of the first electrode lines. At each of the cross-junctions, first and second electrode lines may be interposed by a resistive switching oxide layer to form an RRAM cell.

According to some embodiments, the method of fabricating the RRAM cell comprises forming a first electrode, forming a resistive switching oxide layer comprising a metal oxide by thermal atomic layer deposition (ALD) and forming a second electrode by thermal atomic layer deposition (ALD), where the resistive switching layer is interposed between the first electrode and the second electrode. It will be appreciated that a thermal ALD process is a deposition performed without use of a plasma. Accordingly, in some embodiments, forming the resistive switching oxide layer is performed without exposing a surface of the switching oxide layer to surface-modifying plasma treatment after depositing the metal oxide. In some embodiments, forming the second electrode by thermal atomic layer deposition is performed at a temperature of about 325° C. or less, e.g., about 200-300° C. or about 200-250° C.

Reference will now be made to the Figures, in which like numerals refer to like features throughout.

FIG. 1 illustrates a cross-sectional view of a 3D-RRAM array 10 according to some embodiments. The 3D-RRAM array 10 includes a plurality of sub-arrays 10a formed on a semiconductor substrate 12. The number of sub-arrays within a 3D-RRAM array 10 may be any suitable number according to the particular array architecture employed. However, for simplicity of illustration, only two such sub-arrays 10a are illustrated in FIG. 1. Each sub-array 10a has at least one other adjacent sub-array in the x-direction. In the illustrated embodiment in FIG. 1, the two sub-arrays 10a are adjacent to and face one another in the x-direction.

Each of the sub-arrays 10a includes a plurality of first electrode lines 16 that are stacked in the z-direction and extending in and out of the page in the y direction. For simplicity of illustration, cross-sections of only three first electrode lines 16 for a given sub-array 10a are illustrated in FIG. 1. However, the number of stacked first electrode lines 16 in a given sub-array may be any suitable number N according to the particular array architecture. In addition, adjacently stacked first electrode lines 16 may be separated by an interposing inter-layer dielectric 38a. Thus, in FIG. 1, a stack of first electrodes for a given sub-array includes N stacked first electrode lines 16 and (N−1) interposing inter-layer dielectric layers 38a. According to various implementations, N, the number of stacked first electrode lines 16, can be, for example, 8, 16, 32, 64, 128, 256, etc., depending on the particular array architecture. The first electrode lines 16 may sometimes be referred to as local bit lines, bit lines, or columns.

Each of the sub-arrays 10a further includes a plurality of second electrode lines 14 extending vertically in the z-direction. In some implementations, the second electrode lines 14 form vertical pillars. For simplicity of illustration, a cross-section of only one second electrode line 14 per sub-array 10a is illustrated in FIG. 1. However, the number second electrode lines 14 in a given sub-array may be any suitable number M according to the particular array architecture employed. In the configuration of FIG. 1, there may be additional electrode lines 14 (not illustrated) in front of and behind the electrode line whose cross-sectional view is illustrated in FIG. 1, in the y-direction in and out of the paper. According to implementations, each of the sub-arrays 10a can include, for example, N second electrode lines, where N equals 256, 512, 1024, 2048, 4096, etc., depending on the particular array architecture. The second electrode lines 14 may sometimes referred to as word lines, local word lines, or rows.

In one configuration, hereinafter referred to as a "wrapped word line architecture," the second electrode line 14 extends through a vertical via extending through the stack of first electrodes 16 and inter-layer dielectrics 38a. In this embodiment, the first electrode lines 16 form elongated slabs extending in the y direction and traversing at least a subset of M second electrode lines 14 in the y direction. In this configuration, the sidewalls of the vertical vias are lined with a resistive switching oxide layer 18. In addition, the second electrode lines 14 fill the vertical vias lined with the resistive switching oxide layer 18 to form rods, which may be cylindrical, extending through the vias that extend through the entire stack of first electrode lines 16 and interposing inter-layer dielectrics 38a. One RRAM cell is formed at each intersection between a first electrode line 16 and a second electrode 14 line, interposed by a resistive switching oxide layer 18 surrounding the second electrode line 14. When a cell is selected by applying an appropriate voltage between a selected first electrode line 16 and a second electrode line 14, a conductive path can form anywhere across the resistive switching oxide layer 18 surrounding the second electrode line 14. Thus, in the wrapped word line architecture, the RRAM cell comprises a second electrode line 14 extending in the z-direction, a resistive switching oxide layer 18 continuously surrounding the second electrode line 14, and the first electrode line 16 surrounding the resistive switching oxide layer 18 surrounding the second electrode line 14. In some embodiments, the second electrode line 14 may take the form of a cylindrical rod.

Still referring to FIG. 1, in another configuration, hereinafter referred to as "intersecting word line architecture," the second electrode line 14 extends through a vertical via extending in the z-direction as in the wrapped word line architecture discussed above. Similar to the wrapped word line architecture, the second electrode line 14 of the intersecting word line architecture extends through a stack of first electrode lines 16a/16b and inter-layer dielectrics 38a interposed between two adjacently stacked first electrode lines 16a/16b. Also similar to the wrapped word line architecture, the sidewalls of the vertical vias, which may be cylindrical, are lined with resistive switching oxide layer 18. In addition, the second electrode lines 14 fill the vertical vias lined with the resistive switching oxide layers 18 to form rods, which may be cylindrical, extending through the vias.

Unlike the wrapped word line architecture, however, the first electrode lines do not form slabs having holes through which cylindrical second electrodes 14 extend. Instead, a pair of first electrode lines 16a and 16b extend in the y direction and intersect portions of first and second sides of the second electrode lines 14. Disposed at each intersection between the first electrode lines 16a and 16b are first and second resistive switching oxide layers 18a and 18b, respectively. That is, each of the pair of first electrodes 16a and 16b form elongated lines extending in the y direction and "share" one second electrode 14. Unlike the wrapped word line architecture, therefore, one conductive path can form across each of the first and second resistive switching oxide layers 18a or 18b between the second electrode line 14 and one of the selected first electrode lines 16a or 16b. As a result, unlike the wrapped word line architecture, two conductive paths for the same RRAM cell foot print can be formed. Thus, in this configuration the RRAM cell comprises a second electrode line 14 forming a cylindrical rod extending in the z-direction, a pair of first electrode lines 16a and 16b extending in the y direction and forming a pair of intersections with the second electrode line 14, and first and second resistive switching oxide layers 18a and 18b interposed between first electrode lines 16a and 16b and the second electrode line 14 at the pair of intersections.

The 3D RRAM array of the illustrated embodiment in FIG. 1 may further comprise one or more transistors 22 connected to the second electrode lines 14. Each of the transistors 22 is formed in the semiconductor substrate 12 and comprises a gate 28, a source 32, a drain 34, and is connected to the second electrode line 14 through a vertical connector 20. Interlayer dielectrics 38b and 38c electrically insulate various conducting structures. In one embodiment, the transistor 22 can provide a selecting function for a second electrode line 14 and can supply the requisite current through suitable biasing of the gate 28 through a gate contact (not shown) and the source 32 through a source contact 26. In some embodiments, the transistors 22 are configured to supply a drive current sufficient to program and erase at least one RRAM cell.

While the sub-arrays 10a are disposed over and overlapping the transistors 22 when viewed the z-direction in the illustrated embodiment of FIG. 1, other embodiments are possible. In some embodiments, the sub-arrays 10a are disposed over but not overlapping the transistors 22 when viewed in the z-direction. In other embodiments, the transistors 22 are disposed over and overlapping the sub-arrays 10a when viewed in the z-direction. In yet other embodiments, the transistors 22 and the sub-arrays 10a are disposed adjacent to each other in the x-direction.

Forming the transistors 22 at different points in the overall fabrication process flow may result in different processing considerations. For example, in the illustrated example of FIG. 1, one consideration arising from the transistors 22 and the associated electrical connections such as vertical connectors 20 being fabricated prior to fabricating the sub-arrays 10a can be a temperature constraint. In some embodiments, high temperature processes subsequent to fabrication of the transistors 22 can lead to undesirable post-fabrication shifts in device parameters such as the threshold voltage, the sub-threshold swing, the punch-thru voltage, among others. In addition, in processes where portions of the vertical connectors include low-temperature melting metals such as Cu or Al, subsequent process temperatures are limited to temperatures where such effects do not pose a significant concern. Thus, it may be desirable to limit the temperature of various processes to typical back-end processing temperatures. In some embodiments, a fabrication temperature for sub-arrays 10a may be lower than about 400° C. In other embodiments, the fabrication temperature for sub-arrays 10a may be lower than about 350° C. In yet other embodiments, the fabrication temperature for sub-arrays 10a may be lower than about 300° C.

In addition, as discussed above, various process integration approaches of such 3D RRAM arrays require conformal deposition of a resistive switching oxide layer and at least one of the first or second electrode lines on surfaces of vias and cavities having very high aspect ratios. While plasma-enhanced processes such as PE-ALD may be effective in lowering deposition temperatures for deposition on some exposed surfaces, such processes may not be effective in depositing inside vias and cavities having the high aspect ratios. Advantageously, thermal atomic layer depositions according to embodiments disclosed herein can effectively deposit into high aspect ratio features, for forming various films of the 3D RRAM arrays.

Additionally, in embodiments where the transistors 22 and the associated electrical connections are fabricated prior to fabricating the sub-arrays 10a, usage of plasma processes may pose additional concerns. During a plasma process, certain conducting structures of partially fabricated integrated circuit devices may accumulate charge from the plasma. The accumulated charge can lead to a discharging event during processing, leading to high levels of current flowing through various current paths, for example, through diodes, gate dielectrics of transistors, and RRAM devices. Such discharging events can lead to performance and reliability degradation of the integrated circuit devices, including RRAM devices. For example, a discharging event can lead to a degradation of resistive switching oxide layers. Thus, for these reasons, it may be desirable to use thermally activated processes in lieu of plasma processes and not exceed the backend processing temperature regimes discussed above.

The 3D RRAM array 10 of FIG. 1 can be fabricated in any number of ways. In FIG. 1, starting from the semiconductor substrate 12, structures up to and including the vertical connectors 20 can be fabricated using silicon fabrication processes well known to a person having ordinary skilled in the art. Prior to forming the sub-arrays 10a, a planar surface exposing vertical connectors 20 and inter-layer dielectric layer 38b is provided using fabrication processes well-known to a person having ordinary skill in the art, such as a subtractive metal flow or a dual-damascene flow. In the following, fabrication processes for sub-arrays 10a will be discussed in detail.

Subsequent to formation of vertical connectors 20, in some embodiments, hereinafter referred to as relating to a "bitline-first flow," a stack comprising N layers of interlayer dielectric 38a and N first electrode layers are alternatively deposited.

The first electrode layer comprises any suitable conductive and semiconductive materials including n-doped poly silicon and p-doped poly silicon, metals including C, Al, Cu, Ni, Cr, Co, Ru, Rh, Pd, Ag, Pt, Au, Ir, Ta, and W, conductive metal nitrides, conductive metal silicides including tantalum silicides, tungsten silicides, nickel silicides, cobalt silicides, and titanium silicides, and conductive metal oxides including $RuO_2$. In some embodiments, the second electrode material includes a transition metal and may be, for example, a transition metal nitride, such as TiN, TaN, WN, or TaCN. In the bitline-first flow, first electrode layer can be deposited using various processes for depositing a planar film, including chemical vapor deposition (CVD), plasma-enhanced chemical vapor deposition (PE-CVD), plasma-enhanced atomic layer deposition (PE-ALD), and physical vapor deposition (PVD), among others. In some embodiments, the first electrode layer is formed by thermal atomic layer deposition (ALD).

The inter-layer dielectric 38a comprises electrically insulating dielectric material including, for example, $SiO_2$ or $Si_3N_4$, among others. The inter-layer dielectric 38a can be formed using a process for depositing a planar film, including chemical vapor deposition (CVD), plasma-enhanced chemical vapor deposition (PE-CVD), high density chemical vapor deposition (HDP-CVD), thermal atomic layer deposition (ALD), plasma-enhanced atomic layer deposition (PE-ALD), spin-on dielectric processes (SOD), and physical vapor deposition (PVD), among others.

Subsequently, according to one aspect of the bitline-first flow, vertical vias are formed through the stack comprising N layers alternating interlayer dielectrics 38a and first electrode layers using patterning techniques, e.g., lithography and etch techniques, suitable for forming high aspect-ratio vias. In some embodiments, the vias have a diameter in the range between about 20 nm and about 500 nm, or between about 20 nm to about 100 nm. In addition, in some embodiments, the vias have a depth in the range between about 0.5 μm and about 20 μm, or between about 0.5 μm and about 5 μm.

The sidewalls of the vertical vias may subsequently be lined with the resistive switching oxide layer 18. Examples of resistive switching oxide layers include thin films comprising metal oxide materials, e.g., NiO, $HfO_2$, $ZrO_2$, $Cu_2O$, $TaO_2$, $Ta_2O_5$, $TiO_2$, $SiO_2$, $Al_2O_3$ and/or alloys including two or more metals, e.g., transition metals, alkaline earth metals, and/or rare earth metals. In general, the resistive switching oxide layer 18 can be formed by a thermal atomic layer deposition (ALD), which can be particularly advantageous for forming 3D RRAM memory cells. For example, for vias having relatively high aspect ratio and/or relatively small diameter, ALD-type processes can facilitate the deposition of exceptionally conformal layers. Furthermore, a plasma may not reach deeper portions of high aspect ratio vias under some circumstances. In these circumstances, different portions of vias may be exposed to different amounts of the plasma, leading to undesirable structural effects of non-uniform deposition, such as thicker films being deposited near the opening of the via compared to deeper portions (sometimes called cusping). For these reasons, a thermal ALD may be more advantageous, because thermal ALD does not depend on the ability of the plasma to reach portions of the surface being deposited on.

Subsequently, according to another aspect of the "bitline-first flow," the resistive switching oxide layer 18 formed at the bottom of the vertical vias may be removed by a suitable etch technique in order to make electrical contacts between the transistors 22 and the second electrode lines 14. Subsequently, the vertical vias lined with resistive switching oxide layers 18 are filled with a suitable second electrode material for the second electrode lines 14. Possible second electrode materials include suitable conductive and semiconductive materials including n-doped poly silicon and p-doped poly silicon, metals including C, Al, Cu, Ni, Cr, Co, Ru, Rh, Pd, Ag, Pt, Au, Ir, Ta, and W, conductive metal nitrides, conductive metal silicides including tantalum silicides, tungsten silicides, nickel silicides, cobalt silicides, and titanium silicides, and conductive metal oxides including $RuO_2$. In some embodiments, the second electrode material includes a transition metal and may be, for example, a transition metal nitride, such as TiN, TaN, WN, or TaCN. The second electrode material can be deposited using a thermal atomic layer deposition (ALD). As discussed above in connection with the deposition of resistive switching oxide layer 18, for vias having relatively high aspect ratio and/or relatively small diameters, ALD-type processes can facilitate the deposition of exceptionally conformal layers. In addition, as discussed above for deposition of resistive switching oxide layers, under circumstances where different portions of a via may be exposed to different amounts of the plasma, thermal ALD may provide advantages compared to PE-ALD, so as to avoid undesirable structural effects arising from non-uniform plasma exposure such as higher amounts of the second electrode material being deposited near the opening of the via compared to deeper portions, which can lead to unintended voids within the second electrode lines 14.

Subsequently, according to another aspect of the "bitline-first flow," the sub-arrays 10a may be planarized to remove excess second electrode material. The sub-arrays 10a are then separated, thereby separating the first electrode layer into first electrode lines 16 for each sub-array 10a using suitable lithography and etch techniques for etching through multiple stacks of alternating insulators and conductors. Inter-sub-array gaps formed between the sub-arrays 10a are subsequently filled with inter-layer dielectric 38a and planarized using similar materials and techniques discussed above. Subsequently, additional processes may follow to further connect first electrodes 16 and second electrodes 14 to higher level metal lines.

In some other embodiments, hereinafter referred to as relating to a "bitline-last flow," processes steps prior to forming the sub-arrays 10a are substantially the same as in the bitline-first flow. Subsequently, in contrast to the bitline-first flow, the deposited stack of N layers of interlayer dielectric 38a and N first electrode layers comprise depositing first electrode layers that are sacrificial. Sacrificial first electrode layers may comprise any suitable layer that can be selectively removed later in the process, either by wet etch or dry etch, while not removing the interlayer dielectric 38a nor the resistive switching oxide layer 18. For example, in embodiments where the interlayer dielectric 38a is $SiO_2$, the sacrificial first electrode layers may be $Si_3N_4$ layers or polycrystalline Si layers. Subsequently in the bitline-last flow, the processing steps leading up to and including separating the sub-arrays are substantially similar to bitline-first flow, aside from the fact that materials being etched in forming the vertical vias, for example, include sacrificial first electrode material instead of a permanent first electrode material.

According to one aspect of the bitline-last flow, upon separation of the sub-arrays 10a using suitable lithography and etch techniques, the sacrificial first electrode layers are replaced with permanent first electrode materials to form the first electrode lines 16. The removal of the sacrificial first electrode layer can be performed using wet or dry etch techniques suitable for preferentially removing the sacrificial first electrode material while not removing the inter-layer dielectric 38a nor the resistive switching oxide layer 18. For example, in an embodiment where the interlayer dielectric 38a is $SiO_2$, the sacrificial first electrode layers are $Si_3N_4$ layers, and the resistive switching oxide layer 18 is $HfO_x$, a suitable etch process can be a wet-etch that selectively removes $Si_3N_4$ while leaving the $SiO_2$ and the $HfO_x$ intact.

In another aspect of the bitline-last flow, horizontal recessed cavities formed by removal of sacrificial first electrode layers are filled with a suitable permanent first electrode material, which includes substantially the same materials as suitable second electrode materials discussed above in connection with the bitline-first flow. Unlike the bitline-first flow where the first electrode layers can be deposited using various processing techniques for depositing the first electrode layer on a substantially planar surface, some processing techniques may not be suitable for depositing the permanent first electrode material in the bitline-last flow. This is because the permanent first electrode material is deposited on surfaces of horizontal recessed cavities. As a result, processes suitable for depositing permanent first electrode material in the bitline-last flow can include processes similar to those used for depositing the second electrode material into high aspect ratio vias. In some embodiments, the first electrode material is deposited by thermal ALD. It is contemplated that chemical vapor deposition (CVD), plasma-enhanced chemical vapor deposition (PE-CVD), plasma-enhanced atomic layer deposition (PE-ALD) may also be applied to deposit the first electrode material in some circumstances, including where requirements for conformality are more relaxed. As discussed above in connection with deposition of the resistive switching oxide layer 18 and the second electrode material on inner surfaces of vias having relatively high aspect ratio and/or small diameter for bitline-first flow, the second electrode material may be deposited on inner surfaces of horizontal cavities by a thermal ALD process. In addition, as discussed above for the bitline-first flow, because different portions of horizontal cavities may be exposed to different amounts of a plasma, thermal ALD may provide advantages compared to PE-ALD, so as to avoid undesirable structural effects arising from non-uniform plasma exposure such as higher amounts of the second electrode material being deposited in horizontal cavities located near the opening of an inter-sub-array gap compared to horizontal cavities located deeper in the inter-sub-array gap.

Subsequently in another aspect of the bitline-last flow, separated first electrode lines 16 are formed by removing first electrode materials from the sidewall surfaces of the inter-layer dielectric 38a between the first electrode lines 16. Subsequent processes for filling the inter-sub-array gaps between the sub-arrays 10a with inter-layer dielectric 38a and planarizing are substantially similar as discussed above for bit-line first flow. Also similar to bit-line first flow, additional processes may follow to further connect first electrodes 16 and second electrodes 14 to higher level metal lines.

Figure 2:
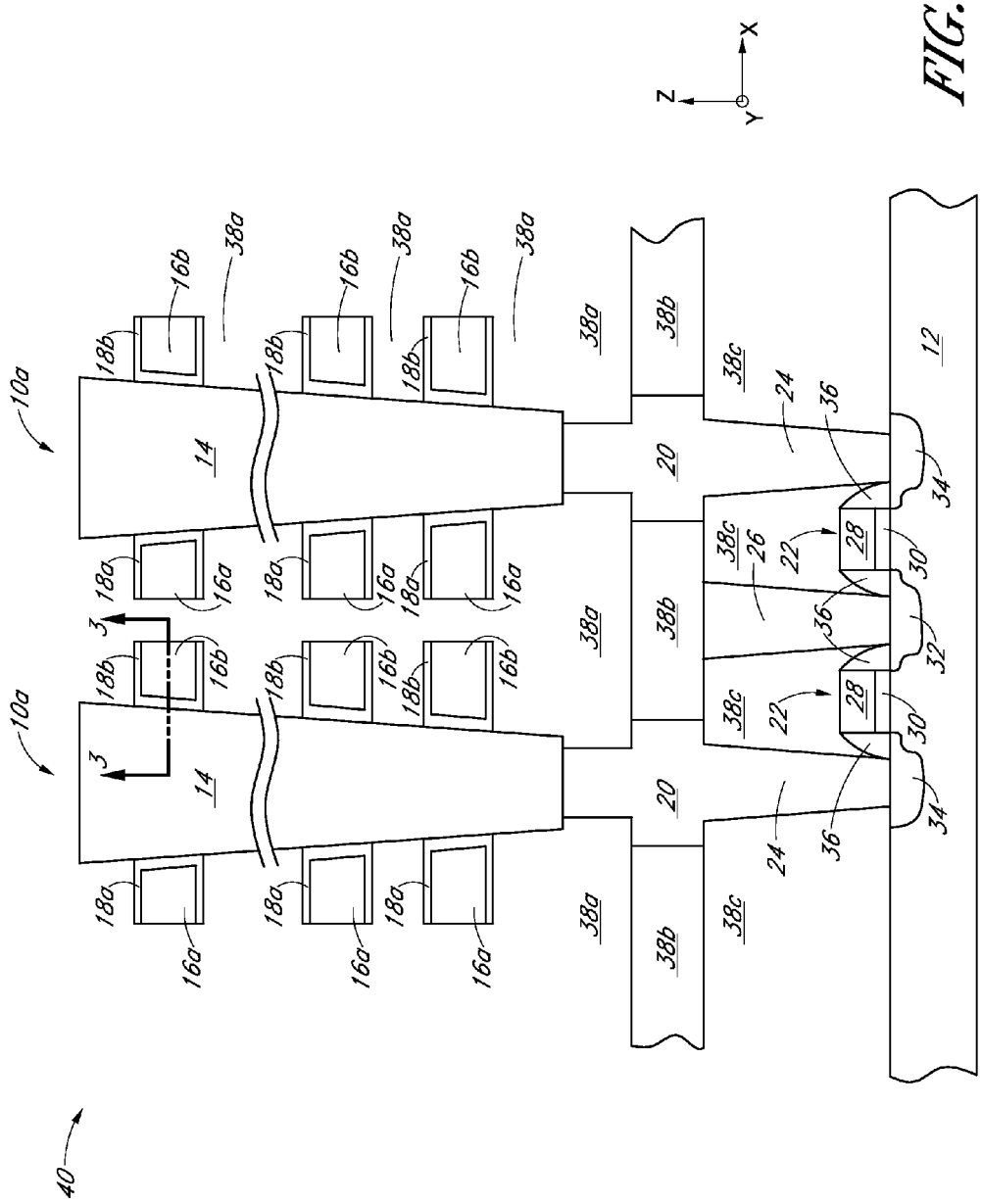
FIG. 2 is a schematic cross-sectional illustration of a 3D RRAM array according to some other embodiments.

FIG. 2 illustrates a cross-sectional view of 3D-RRAM array 40 according to some other embodiments. The overall array architecture of the 3D-RRAM array 40 is similar to that of the 3D-RRAM array 10 of FIG. 1, and the 3D-RRAM array 40 also includes a plurality of sub-arrays 10a.

The overall sub-array architecture illustrated in FIG. 2 is also similar to the example of intersecting word line architecture discussed above in connection with FIG. 1, except for certain features, which are described herein. For example, similar to FIG. 1, the second electrode lines 14 extend through a vertical via extending in the z-direction through a stack of pairs of first electrode lines 16a and 16b and interposing inter-layer dielectrics 38a. Unlike the embodiment of FIG. 1, however, first and second resistive switching oxide layers 18a and 18b of the intersecting word line architecture in FIG. 2 do not line the vertical vias. Instead, first and second resistive oxide layers 18a and 18b line a horizontal cavity formed upon removal of sacrificial first electrode materials, in a similar manner as described above in connection with the bitline-last flow. Accordingly, the second electrode lines 14 fill entire volumes of vertical vias to form cylindrical rods because there are no underlying resistive switching oxide layers.

As a result, the resulting array architecture is similar to the intersecting word line architecture of FIG. 1 in some aspects. For example, each of the pair of electrodes 16a and 16b form elongated lines extending in the in the y direction and "share" one second electrode 14 such that two conductive paths are formed for each RRAM cell formed at each of the intersections between one of the first electrodes 16a and 16b and a second electrode 14. Thus, in this embodiment, the RRAM cell comprises a second electrode line 14 rod extending in the z-direction, a pair of first electrode lines 16a and 16b extending in the y direction and forming a pair of intersections with the second electrode line 14, and resistive switching oxide layers 18a and 18b interposed between first electrode lines 16a and 16b and the second electrode line 14 at the pair of intersections.

The process flow to fabricate the 3D-RRAM array 40 is also similar to the "bitline last" process flow above in connection with FIG. 1 in some aspects, except that the resistive switching oxide layers 18a and 18b are not deposited prior to filling vias with second electrode materials to form the second electrodes 14. Instead, the resistive switching layers 18a and 18b are conformally deposited in the horizontal recessed cavities formed by removal of sacrificial first electrode layers. The materials and the processes employed to deposit the resistive switching layers 18a and 18b are similar as in the bit line-last process described above in FIG. 1. Also similar to the bit line-last process described above in FIG. 1, the horizontal cavities formed by removal of sacrificial first electrode layers are then filled with a suitable permanent first electrode material, which includes substantially the same materials as suitable second electrode materials discussed above. In addition, the first electrode material can be deposited using a suitable process for depositing a substantially conformal film into the horizontal cavities, similar to processes used for second electrode material deposition in FIG. 1. Thus, as discussed above in connection with the bitline-first flow of FIG. 1, thermal ALD processes may be preferable compared to PE-ALD for the deposition of resistive switching layers 18a and 18b, as well as the permanent first electrode material, so as to avoid undesirable structural effects arising from non-uniform plasma exposure such as higher amounts of the second electrode material being deposited in horizontal cavities located near the opening of an inter-sub-array gap compared to horizontal cavities located deeper in the inter-sub-array gap.

The 3D-RRAM array 40 having intersecting word line array architecture fabricated using the bitline-last process flow of FIG. 2 may be advantageous over the bitline-first process of FIG. 1 in some aspects. For example, the resistive switching oxide layer 18a and 18b are not exposed to etch and clean chemistries prior to being capped with the second electrode material, thus minimizing contamination and other processing issues such as formation of pinholes in the resistive switching oxide layers.

As discussed above, the conducting path of any one of RRAM cells disposed at an intersection formed by a first electrode line 16 and a second electrode line 14 can be programmed to be in a relatively high resistance state, also known as the RESET state. Similarly, the conducting path of any one of the RRAM cells can be programmed to be in a relatively low resistance state, also known as the SET state. In one embodiment, high and low resistance states may correspond to the "1" state and a "0" state in a single bit-per-cell memory system.

Figure 3:
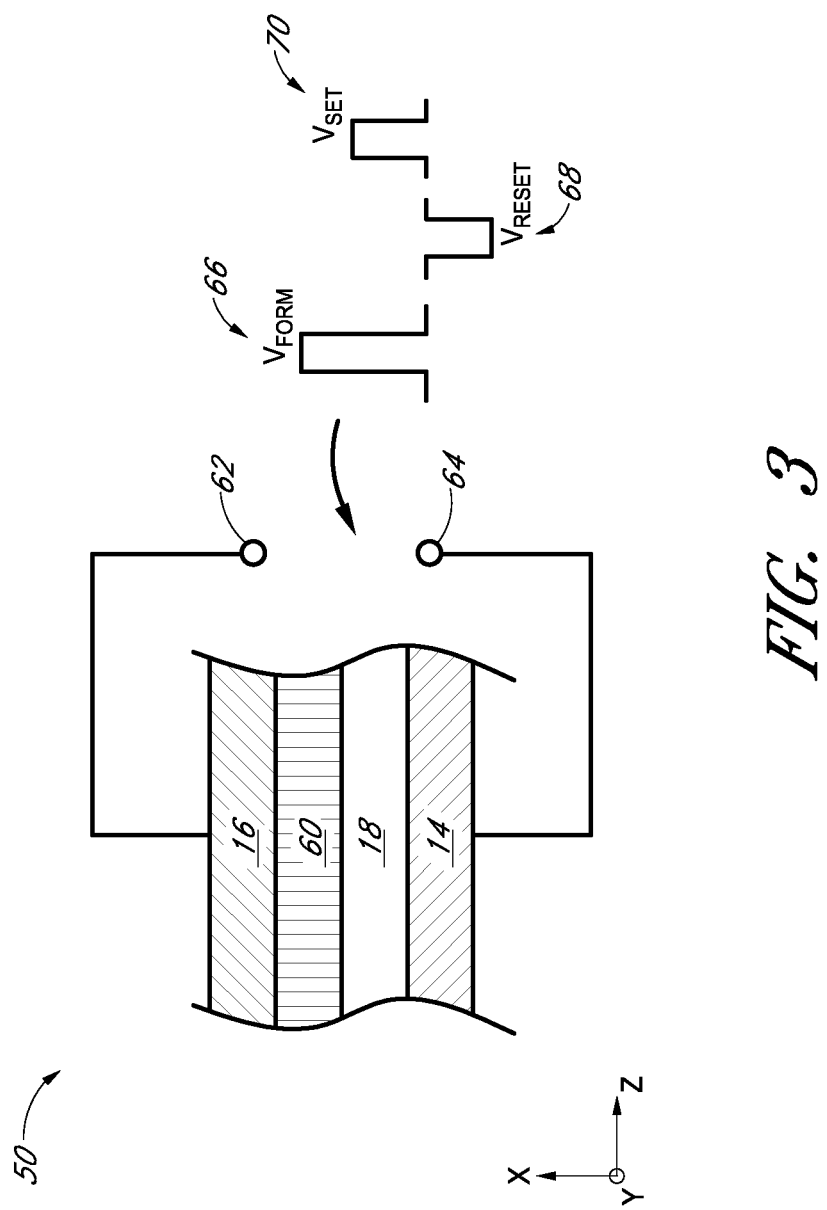
FIG. 3 is a schematic cross-sectional illustration of an RRAM cell stack according to some embodiments

Referring to FIG. 3, details of the material stacks that comprise RRAM cells of FIGS. 1 and 2 are disclosed herein. An RRAM cell stack 50 represents a cross-section taken of an RRAM cell along sections 3 in FIGS. 1 and 2. The cell stack comprises a first electrode 16, a second electrode 14 formed by thermal atomic layer deposition (ALD), and a resistive switching oxide layer 18 comprising a metal oxide formed by thermal atomic layer deposition (ALD), where the resistive switching oxide layer 18 is interposed between first and second electrodes 16 and 14.

Generally, a film growth by ALD occurs through a reaction between atomic layers of adsorbed precursors. In a thermal ALD growth process, the film growth occurs through a surface reaction that is driven by the thermal energy imparted from the temperature of the substrate. In contrast, in a plasma-enhanced (PE-ALD) growth process, the film growth occurs through a surface reaction that is at least partially driven by a plasma process.

In some embodiments, a resistive switching oxide layer 18 may include a sub-stoichiometric metal oxide, which may be represented by $MO_x$, where M is a metal, O is oxygen, and x represents a value less than the stoichiometric saturation value. For example, in embodiments where the resistive switching oxide layer 18 includes hafnium oxide, the sub-stoichiometric oxide may be $HfO_x$, where x is a value less than the saturation stoichiometric value of 2.

It will be appreciated that a resistive switching oxide layer 18 having sub-stoichiometric composition can be used to control the switching behavior of an RRAM device. For example, sub-stoichiometric composition of an oxide can give rise to oxygen vacancies within the oxide, which can become mobile under switching conditions of the RRAM device. In some embodiments, the composition can be tuned to obtain particular switching and other parameters of the RRAM device, such as the switching voltage, switching current, and data retention.

In some embodiments, the sub-stoichiometric composition is achieved by depositing a reactive metal layer such as an elemental transition metal layer between the resistive switching layer 18 and one or both of the first and second electrodes. In these embodiments, the reactive metal layer can intermix with the resistive switching layer 18 during subsequent processes or during device operation to form the sub-stoichiometric composition. In some implementations, metals that form the reactive metal layer include metals that form the resistive switching oxide layer or other metals, including Ni, Hf, Zr, Cu, Ta, Ta, Ti, Si, and Al, among others. In these embodiments, the resistive switching layer 18 is in contact with the reactive metal layer that interposes the resistive switching layer 18 and one or both of the first and second electrodes.

In some other embodiments, the sub-stoichiometric composition is achieved by controlling the composition of the resistive switching layer 18 itself, by controlling deposition parameters such as the deposition temperature and ALD cycle times, among others. In these embodiments, the resistive switching layer is in contact with one or both of the first and second electrodes. In some implementations, x may be a value between about 1.0 and about 2.0 (i.e., 50% to 100% of stoichiometric value). In some other implementations, x may be a value between about 1.5 and about 2.0 (i.e., 75% to 100% of stoichiometric value). Similar degrees of sub-stoichiometric values may be present in other metal oxide systems listed above.

In other embodiments, a resistive switching oxide layer 18 may include an alloy of sub-stoichiometric metal oxides represented by $M_zN_yO_x$, where M is a first metal, N is a second metal, O is oxygen, z and y represent relative amounts of first and second metals, respectively, and x represents a value less than the saturation stoichiometric value. For example, the sub-stoichiometric oxide may be $Hf_zAl_yO_x$, where z and y represent relative amounts of Hf and Al, and x represents a value less than the stoichiometric saturation value. As discussed above, sub-stoichiometric composition of an oxide can give rise to oxygen vacancies within the oxide, which can become mobile under switching conditions of the RRAM device. In one implementation, x may be a value between about 75% and 100% of the stoichiometric value. In another implementation, x may be a value between about 50% and 75% of the stoichiometric value.

In some embodiments, the resistive switching oxide layer 18, e.g., including $HfO_x$, is deposited by thermal ALD using $HfCl_4$ and $H_2O$ as precursors. In some other embodiments, the resistive switching oxide layer 18 including $HfO_x$ is deposited by thermal ALD by using TEMAHf or any derivatives thereof as precursors of Hf with ozone and/or $H_2O$.

In some embodiments, the resistive switching oxide layer 18 is doped with a metal dopant, e.g., Al, Ti, and Ni. For example, the resistive switching metal oxide layer 18 may be doped with aluminum (e.g., in the form of $Al_2O_3$) to form $Hf_zAl_yO_x$ where the switching oxide layer 18 is $HfO_x$. In some embodiments, the resistive switching oxide layer 18 including $HfAlO_x$ is deposited by thermal ALD using TMA and $H_2O$ as $Al_2O_3$ precursors. In some embodiments, the Al concentration is in a range from about 1 atomic percent to about 20 atomic percent (i.e., z=0.95 and y=0.05). In some embodiments, the Al concentration is in a range from about 1 atomic percent to about 10 atomic percent (i.e., z=0.90 and y=0.10), for instance about 5%.

As noted above, metal dopants other than aluminum are possible. In some embodiments, the resistive switching oxide layer 18 is doped with titanium (e.g., in the form of $TiO_2$), which can form $Hf_zTi_yO_x$ where the switching oxide layer 18 is $HfO_x$. In some other embodiments, the $HfO_x$ of the resistive switching oxide layer 18 is doped with nickel (e.g., in the form of $NiO_2$), to form $Hf_zNi_yO_x$.

It will be appreciated, as discussed herein and illustrated in the various graphs noted below, that the deposition temperature of the resistive switching oxide layer 18 can also be important to control the switching condition and other device parameters of the RRAM device. For example, the deposition temperature can be correlated to the composition, e.g., the degree of sub-stoichiometry and hydrogen and/or carbon content. In some embodiments, the resistive switching oxide layer 18 is deposited at temperatures ranging from 200° C. to 325° C. In another embodiment, the resistive switching oxide layer 18 is deposited at temperatures ranging from 200° C. to 250° C. In yet another embodiment, the resistive switching oxide layer 18 is deposited at temperatures ranging from 220° C. to 230° C., for instance about 225° C.

In one embodiment, the thickness of the resistive switching oxide layer 18 including $HfO_x$ has a range between about 40 nm and about 1 nm, for instance about 20 nm. In another embodiment, the thickness of the resistive switching oxide layer 18 including HfO$_x$ has a range between about 20 nm and about 1 nm, for instance about 10 nm. In yet another embodiment, the thickness of the resistive switching oxide layer 18 including HfO$_x$ has a range between about 10 nm and about 1 nm, for instance about 5 nm.

In some embodiments, the cell stack 50 may further comprise an oxygen vacancy-forming layer 60 which promotes the formation of oxygen vacancies in the resistive switching oxide layer 18. In some embodiments, the oxygen vacancy-forming layer 60 includes elemental metal(s) of the resistive switching oxide layer 18 (i.e., M or M and N). For example, where the resistive switching oxide layer 18 is HfO$_x$, the oxygen vacancy-forming layer 60 could include elemental Hf.

In some other embodiments, the oxygen vacancy-forming layer 60 includes a sub-stoichiometric metal oxide including the same metal element (i.e., MO$_x$ or M$_z$N$_y$O$_x$) and a stoichiometry substantially lower in oxygen content than the resistive switching layer. In some implementations, x may be a value between about 25% and about 50% of the stoichiometric value. In some other implementations, x may be a value between about 1% and about 25% of the stoichiometric value. For example, the resistive switching layer 18 can have a stoichiometry of HfO$_{1.5}$, and the oxygen vacancy-forming layer 60 can have a stoichiometry of HfO$_{0.5}$.

In some embodiments, either one or both of first and second electrodes 14 and 16 can be formed by thermal atomic layer deposition (ALD) and can include a metal nitride. In some embodiments, the second electrode 14 formed by thermal ALD includes a TiN layer using precursors comprising TiCl$_4$ and NH$_3$.

In some embodiments, either one or both of first and second electrodes 14 and 16 formed by thermal ALD includes a TiN layer formed at a temperature below about 400° C. In another embodiment, the second electrode 14 formed by thermal ALD includes a TiN layer formed at a temperature between about 350° C. and about 400° C. In yet another embodiment, the second electrode 14 formed by thermal ALD includes a TiN layer formed at a temperature between about 300° C. and about 350° C.

In some embodiments, either one or both of first and second electrodes 14 and 16 formed by thermal ALD includes a TiN layer having a thickness of about 1 nm to about 100 nm. In another embodiment, the second electrode 14 formed by thermal ALD includes a TiN layer having a thickness of about 5 nm to about 50 nm. In yet another embodiment, the second electrode 14 formed by thermal ALD includes a TiN layer having a thickness of about 5 nm to about 30 nm, for instance 10 nm.

Figure 4:
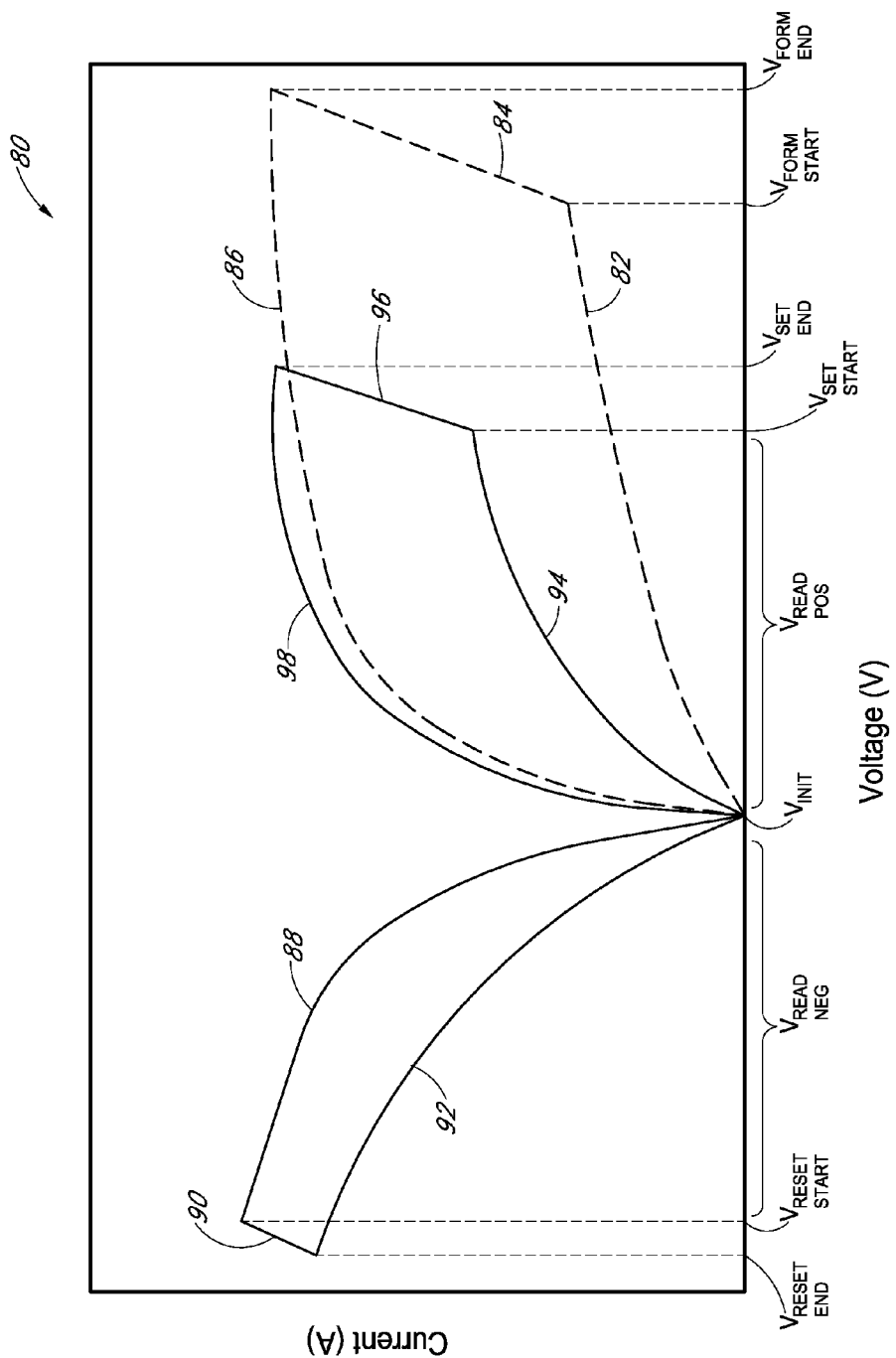
FIG. 4 is a schematic illustration of current-voltage relationships of switching operations of an RRAM cell according to some embodiments.

FIG. 4 represents a schematic current-voltage (I-V) curve 80 representing three access operations that can change the state of an RRAM cell. A forming operation refers to the very first electrical pulse applied to an as-fabricated RRAM cell. An electrical pulse, as referred to herein, can include a suitable voltage or current pulse. In addition, the electrical pulse can have varying degrees of voltage and/or current while being applied, e.g., a DC voltage sweep. In FIG. 4, the x-axis represents a voltage applied across the RRAM cell stack such as the RRAM cell stack 50 in FIG. 3. The y-axis represents the current flowing through the RRAM cell stack at a given voltage.

In FIG. 4, an I-V curve representing the forming operation include a pre-forming high resistance state (HRS) I-V portion 82 ranging in the voltage axis from an initial voltage V$_{INIT}$ to a forming starting voltage V$_{FORM\ START}$ and is characterized by a relatively slow increase in current for a given change in voltage. The I-V curve representing the forming operation further includes a forming HRS-to-LRS transition I-V portion 84 ranging in the voltage axis from V$_{FORM\ START}$ to V$_{FORM\ END}$ and is characterized by a relatively sharp increase in current for a given change in voltage, during which the RRAM cell changes its state from a pre-forming FIRS to a post-formed low resistance state (LRS). The I-V curve representing the return path from V$_{FORM\ END}$ to V$_{INIT}$ is represented by a first LRS return path I-V portion 86.

In some embodiments, forming voltages V$_{FORM\ START}$ and V$_{FORM\ END}$ is related to oxide breakdown voltage (BV), which can be proportional to the electric field. Thus, the forming voltages can depend on factors such as the thickness, density, composition, and the overall quality, among other characteristics, of the resistivity switching oxide layer. As such, these voltages can be controlled by adjusting the above-mentioned deposition parameters of thermal ALD such as the deposition temperature and ALD cycle times.

An I-V curve representing the RESET operation include a LRS I-V portion 88 ranging in the voltage axis from an initial voltage V$_{INIT}$ to a RESET starting voltage V$_{RESET\ START}$ and is characterized by a relatively slow decrease in current for a given change in voltage. The I-V curve representing the RESET operation further includes a RESET LRS-to-FIRS transition I-V portion 90 ranging in the voltage axis from V$_{RESET\ START}$ to V$_{RESET\ END}$ and is characterized by a relatively sharp decrease in current for a given change in voltage, during which the RRAM cell changes its state from the LRS to HRS. The I-V curve representing the return path from V$_{RESET\ END}$ to V$_{INIT}$ is represented by a FIRS return path I-V portion 92.

An I-V curve representing the SET operation include a FIRS I-V portion 94 ranging in the voltage axis from an initial voltage V$_{INIT}$ to a SET starting voltage V$_{SET\ START}$ and is characterized by a relatively slow increase in current for a given change in voltage. This I-V portion is leakier than the analogous I-V portion of the forming I-V curve. The I-V curve representing the SET operation further includes a SET HRS-to-LRS transition I-V portion 96 ranging in the voltage axis from V$_{SET\ START}$ to V$_{SET\ END}$ and is characterized by a relatively sharp increase in current for a given change in voltage, during which the RRAM cell changes its state from the HRS to LRS. The I-V curve representing the return path from V$_{SET\ END}$ to V$_{INIT}$ is represented by a second LRS return path I-V portion 98.

Figure 5:
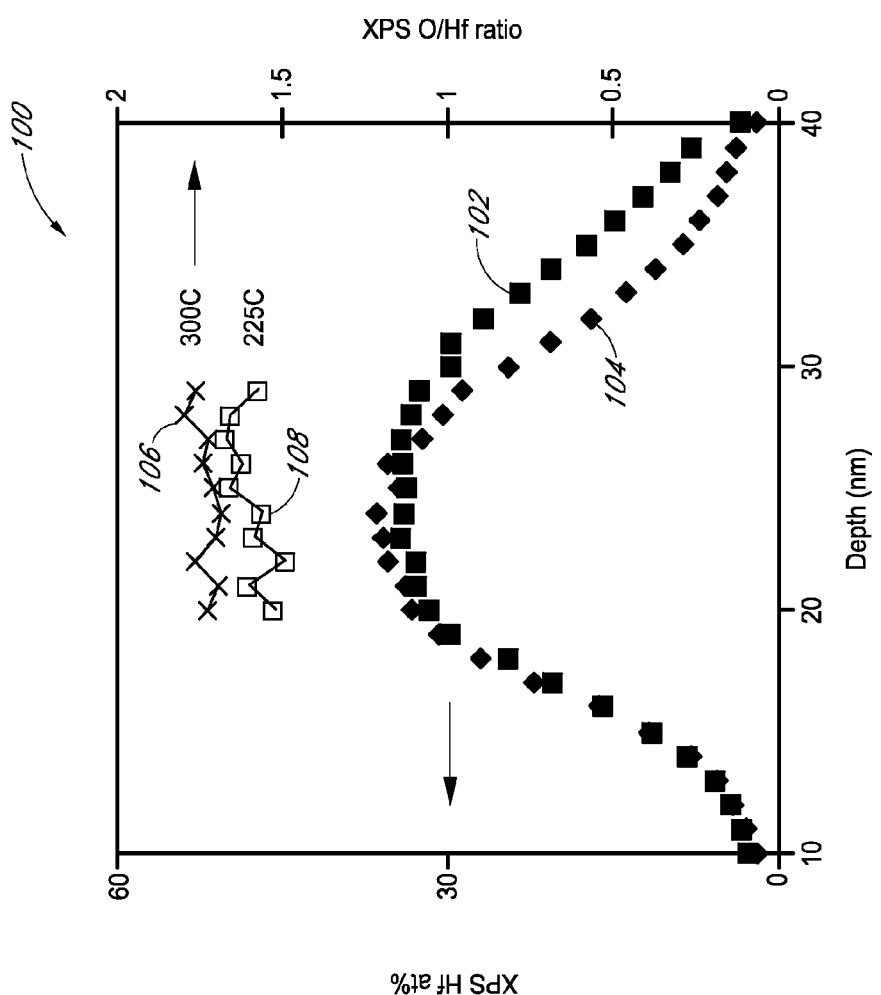
FIG. 5 is an illustration of measured concentration depth profiles of a resistive switching oxide layers according to some embodiments.
Figure 6:
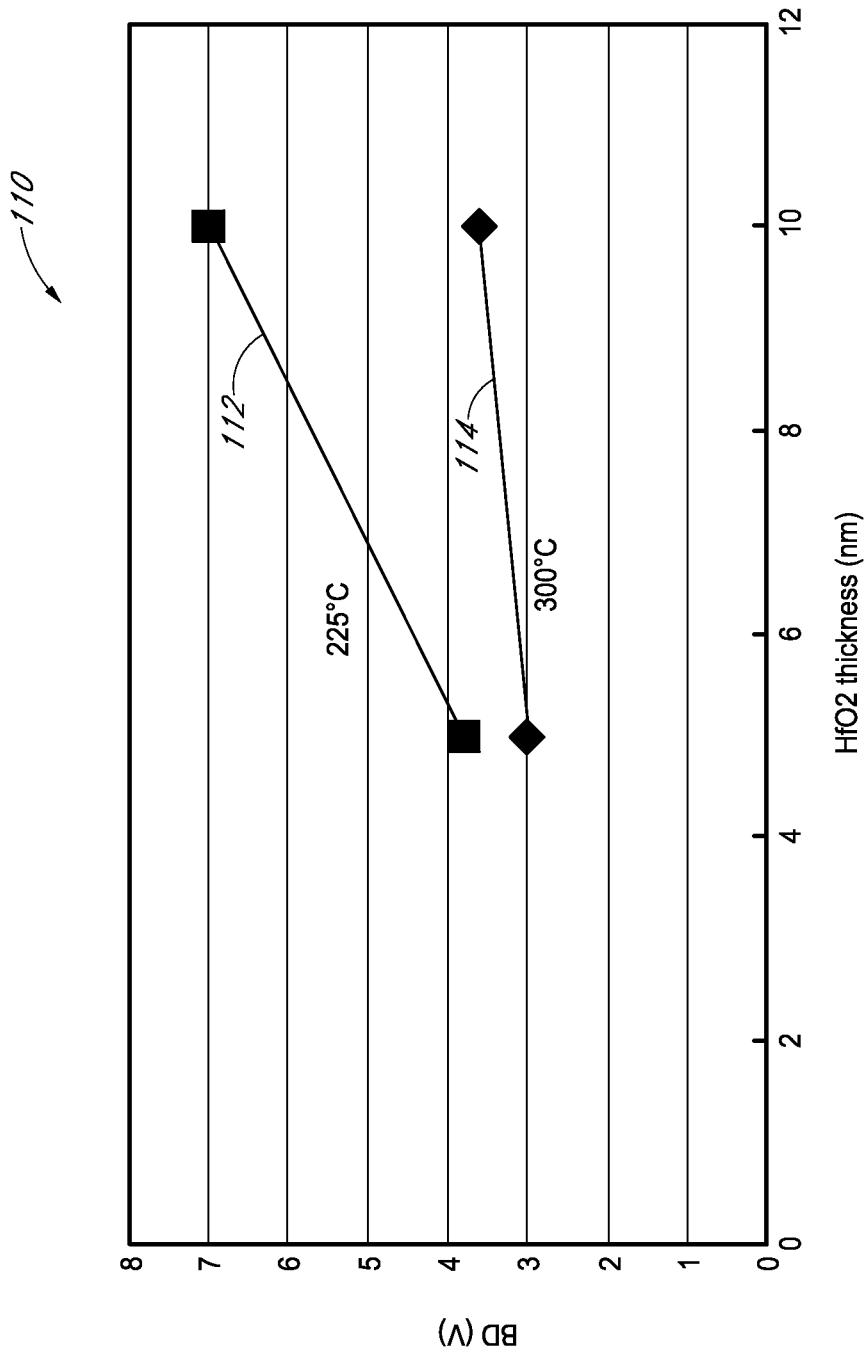
FIG. 6 is an illustration of measured oxide break down voltages of a resistive switching oxide layers according to some embodiments.
Figure 7:
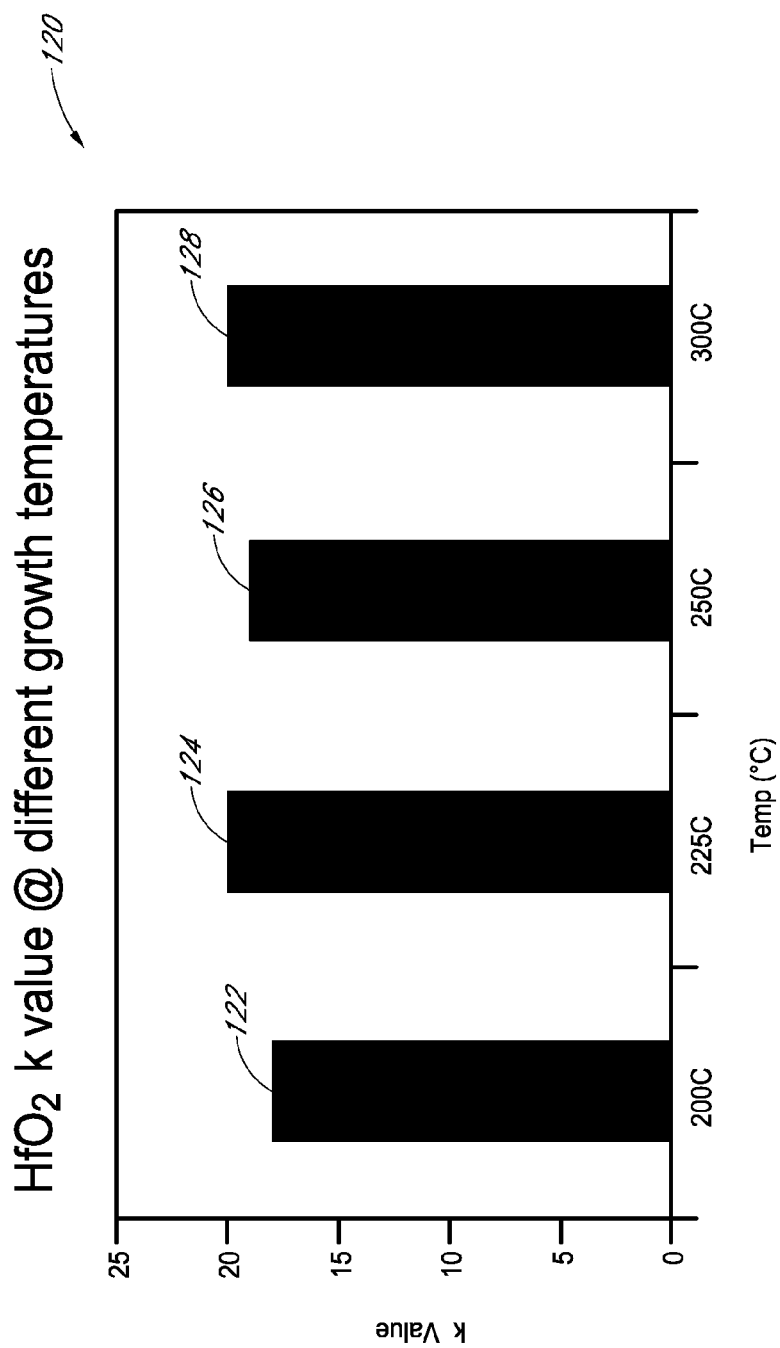
FIG. 7 is an illustration of measured dielectric constants of a resistive switching oxide layers according to some embodiments.

In FIGS. 5 to 10, physical and electrical characterization of resistive switching oxide layer materials and RRAM devices incorporating the same are discussed, according to some embodiments of the present invention. The embodiments of the resistive switching oxide layers in FIGS. 5 to 7 are formed by thermal ALD performed at about 325° C. or less. Advantageously, the RRAM cell stacks including the resistive switching oxide layers do not include reactive metal layers, according to embodiments discussed above in connection with FIG. 3. Accordingly, in the embodiments of FIGS. 8 to 10, the RRAM devices include the resistive switching oxide layers in contact with first and second electrodes.

FIG. 5 illustrates compositional depth profiles 100 of resistive switching oxide layers according to embodiments of the present invention. In particular, the left axis of FIG. 5 represents a quantitative X-ray photoelectron intensity in units of atomic % of 40 nm HfO$_2$ films measured at an electron energy corresponding to Hf metal as a function of the depth from the surface of the resistive switching oxide layer relative to the surface. The first and second Hf atomic percentage depth profiles 102 and 104, represented by connected solid squares and by solid diamonds, respectively, represent depth profiles of Hf in a stoichiometric HfO$_2$ films deposited at two different temperatures of 300° C. and 225° C., respectively. The overlaid profiles 102 ad 104 show that a deposition temperature of 225° C. results in a relative higher peak Hf atomic percentage compared to a higher deposition temperature of 300° C. In addition, the depth profiles demonstrate that the exemplary $HfO_2$ films have highest Hf content at mid-depth of the film (at about 25 nm in depth).

The right axis of FIG. 5 represents a ratio of X-ray photo-electron intensities of Hf metal to that of oxygen measured at respective electron energies as a function of the depth from the surface of the resistive switching oxide layer relative to the surface. The first and second Hf atomic ratio depth profiles 106 and 108, represented by connected open squares and by connected x symbols, respectively, represent depth profiles of Hf in a stoichiometric $HfO_2$ films deposited at two different temperatures of 300° C. and 225° C., respectively. The overlaid atomic ratio profiles 106 ad 108 show that the resistive switching layer of $HfO_x$ has a value of x between about 1.5 and 2. Additionally, the overlaid atomic profiles show that a deposition temperature of 225° C. results in a relatively lower atomic percentage of oxygen (i.e., higher Hf atomic percentage) compared to a higher deposition temperature of 300° C. by about 5%.

FIG. 6 illustrates oxide breakdown voltage (BV) curves 110 of resistive switching oxide layers according to embodiments of the present invention. The y axis represents the voltage at which the resistive switching oxide layers undergo a hard (irreversible) breakdown, which, as discussed above in connection with FIG. 4, may be analogous to forming the RRAM devices in some embodiments. The x-axis represents the thickness of the resistive switching oxide. The first and second BV curves 112 and 114 correspond to $HfO_2$ deposited at 225° C. and 300° C., respectively. The overlaid BV curves 112 and 114 illustrates that while both $HfO_2$ films deposited at 225° C. and 300° C. display higher BV at higher thickness as expected, the amount of increase in BV for a given increase in thickness is higher for the $HfO_2$ film deposited at 225° C. compared to the $HfO_2$ film deposited at 300° C. As a result, for 10 nm films, the film deposited at 225° C. has a significantly higher BV compared to the film deposited at 300° C. A forming voltage $V_{FORM}$ that is substantially higher than a SET voltage $V_{SET}$ may not be desirable for many reasons, including larger transistors to supply larger amounts of current. Thus, the deposition temperature can play a key role in tuning $V_{FORM}$.

FIG. 7 illustrates a dielectric constant (k-value) comparison chart 120 showing k value bar charts 122, 124, 126, and 128 corresponding to first through fourth 10 nm $HfO_2$ resistive switching oxide layers deposited at 200° C., 225° C., 250° C., and 300° C., respectively. The k-value comparison chart 120 illustrates that the k-values of 10 nm $HfO_2$ films are between about 15 and 20 and do not significantly vary with deposition temperature.

Figure 8:
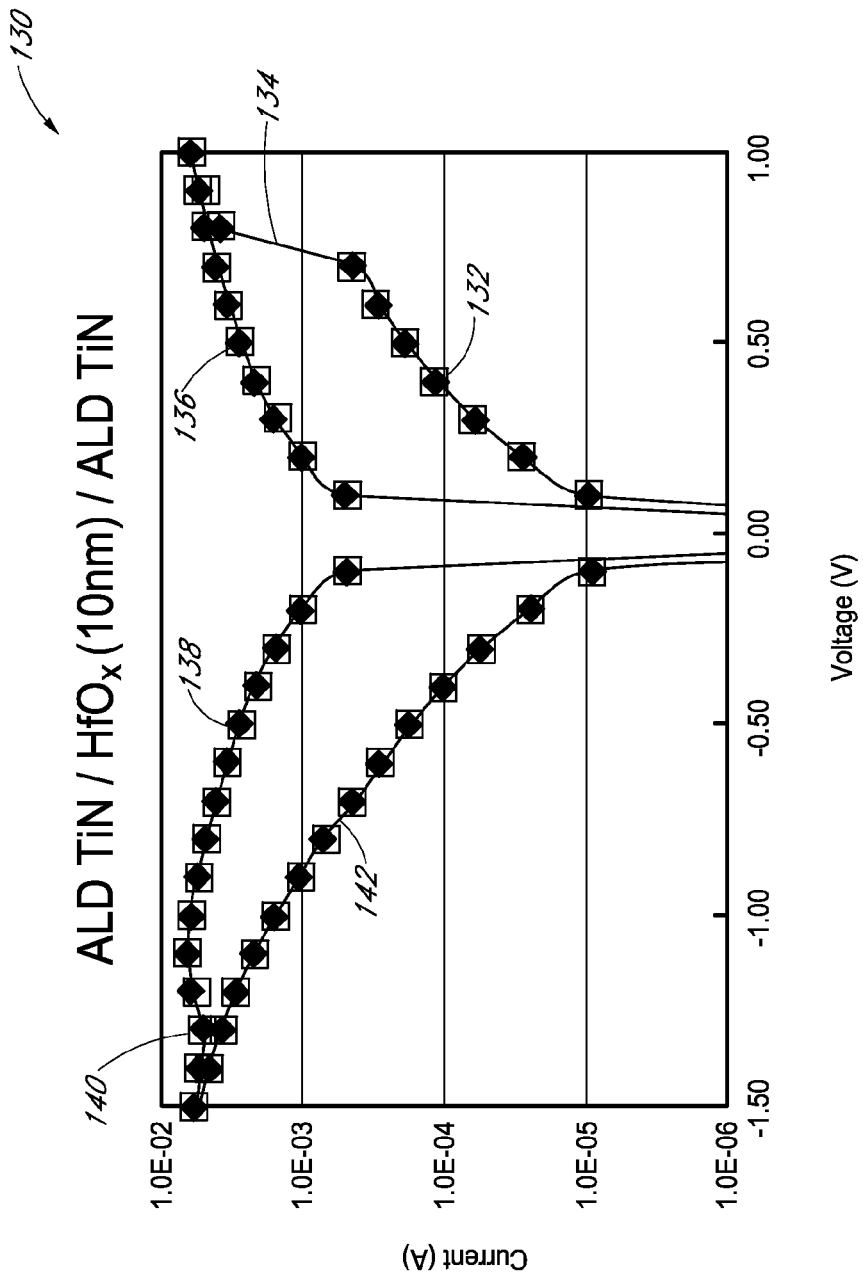
FIG. 8 is an illustration of measured current-voltage relationship of an RRAM cell according to some embodiments.
Figure 9:
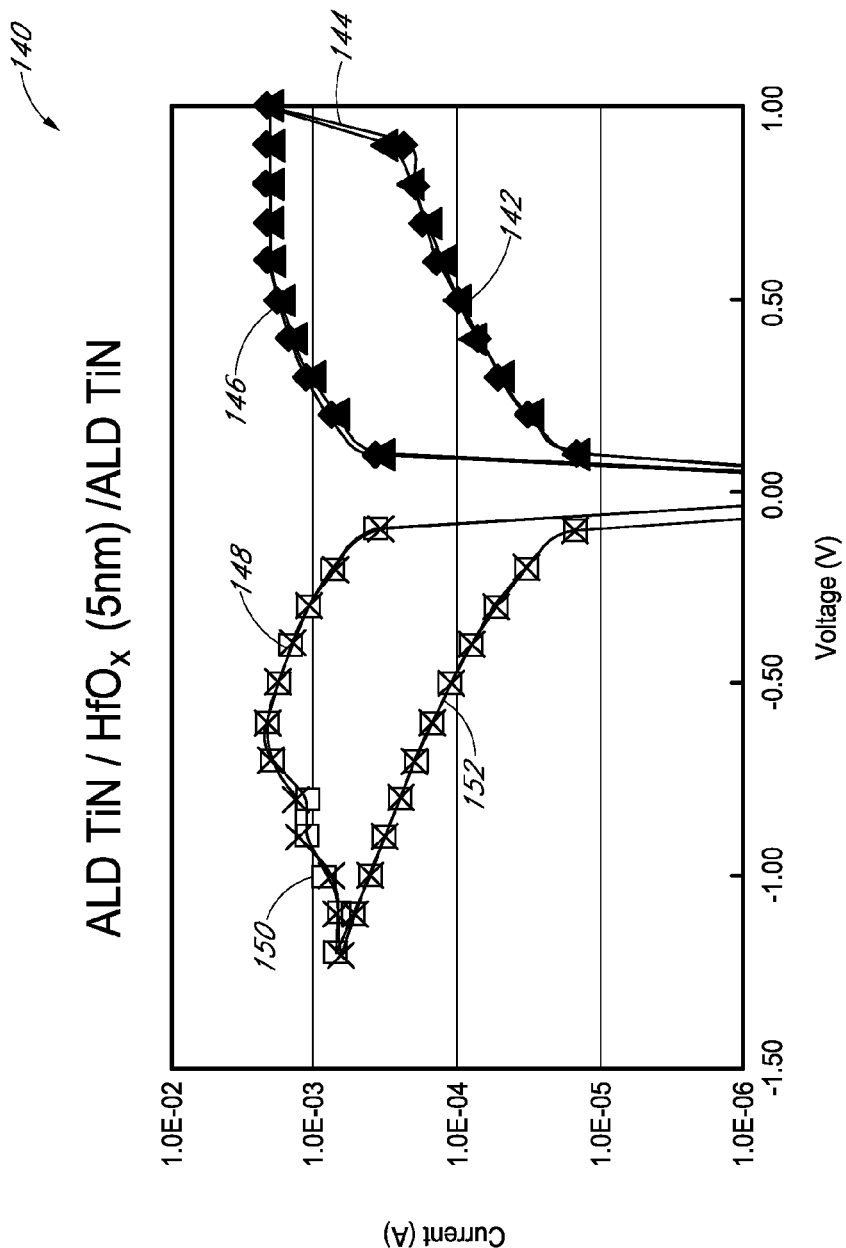
FIG. 9 is an illustration of measured current-voltage relationship of an RRAM cell according to some embodiments.

FIGS. 8 and 9 illustrate I-V curves of RRAM cells comprising $HfO_x$ resistive switching oxide layers disposed between a first and second electrodes comprising TiN. The I-V curve 130 of FIG. 8 corresponds to an RRAM cell having 10 nm $HfO_x$ grown at 225° C. and the I-V curve 140 of FIG. 9 corresponds to an RRAM cell having 5 nm $HfO_x$ grown at 225° C.

A SET portion of the I-V curve 130 of FIG. 8 includes a SET HRS I-V portion 132 ranging in the voltage axis from an a $V_{INIT}$ of about zero to $V_{SET\ START}$ of about 0.7V, a SET HRS-to-LRS transition I-V portion 134 ranging in the voltage axis from a $V_{SET}$START of about 0.7V to about to a $V_{SET\ END}$ of about 0.8V, and a SET return I-V portion 136 from $V_{SET\ END}$ of about 0.8V to $V_{INIT}$ of about zero.

A RESET portion of the I-V curve 130 of FIG. 8 includes a RESET LRS I-V portion 138 ranging in the voltage axis from an a $V_{INIT}$ of about zero to $V_{RESET\ START}$ of about −1.2V, a RESET LRS-to-HRS transition I-V portion 140 ranging in the voltage axis from a $V_{RESET\ START}$ of about −1.2V to a $V_{RESET\ END}$ of about −1.5V, and a RESET return I-V portion 142 from $V_{RESET\ END}$ of about −1.5V to $V_{INIT}$ of about zero.

A SET portion of the I-V curve 140 of FIG. 9 includes a SET HRS I-V portion 142 ranging in the voltage axis from an a $V_{INIT}$ of about zero to $V_{SET\ START}$ of about 0.9V, a SET HRS-to-LRS transition I-V portion 144 ranging in the voltage axis from a $V_{SET}$START of about 0.9V to about to a $V_{SET\ END}$ of about 1.0V, and a SET return I-V portion 146 from $V_{SET\ END}$ of about 1.5V to $V_{INIT}$ of about zero.

A RESET portion of the I-V curve 140 of FIG. 9 includes a RESET LRS I-V portion 148 ranging in the voltage axis from an a $V_{INIT}$ of about zero to $V_{RESET\ START}$ of about −0.7V, a RESET LRS-to-HRS transition I-V portion 150 ranging in the voltage axis from a $V_{RESET\ START}$ of about −0.7V to a $V_{RESET\ END}$ of about −1.2V, and a RESET return I-V portion 152 from $V_{RESET\ END}$ of about −1.2V to $V_{INIT}$ of about zero.

The I-V curves 130 and 140 of FIGS. 8 and 9 corresponding to RRAM cells having 10 nm $HfO_x$ grown at 225° C. and 5 nm $HfO_x$ grown at 225° C., respectively, demonstrate ON/OFF ratios as measured by $V_{READ}$ at 0.3V of 25 and 20, respectively.

Figure 10:
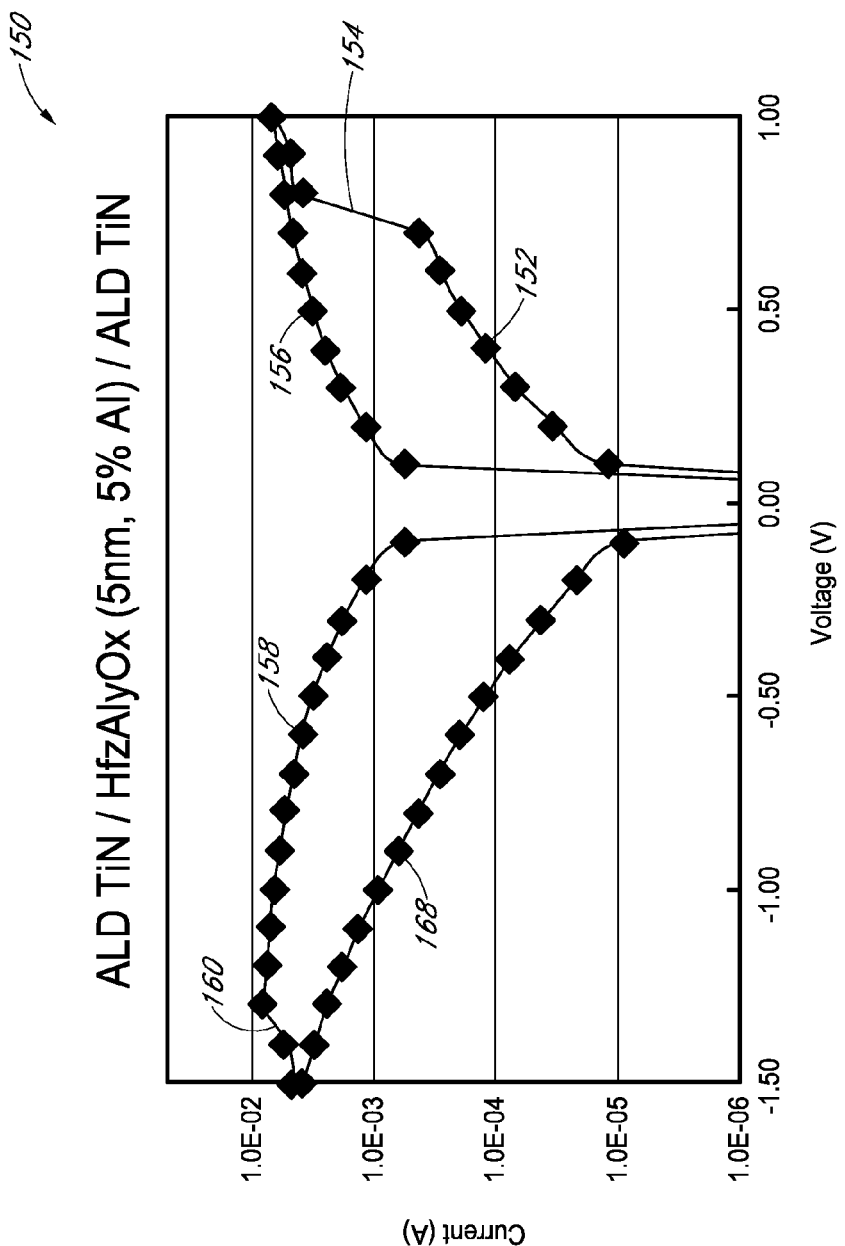
FIG. 10 is an illustration of measured current-voltage relationship of an RRAM cell according to some other embodiments.

FIG. 10 illustrates an I-V curve of an RRAM cell comprising an $Hf_zAl_yO_x$ resistive switching oxide layer disposed between a first and second electrodes comprising TiN. The I-V curve 150 of FIG. 8 corresponds to an RRAM cell having 5 nm $Hf_zAl_yO_x$ grown at 300° C. and doped with about 5 atomic percent Al (i.e. z=0.95 and y=0.05). The $Hf_zAl_yO_x$ resistive switching oxide layer had a BV of the film was 3.8 V A SET portion of the I-V curve 150 of FIG. 10 includes a SET HRS I-V portion 152 ranging in the voltage axis from an a $V_{INIT}$ of about zero to $V_{SET\ START}$ of about 0.7V, a SET HRS-to-LRS transition I-V portion 154 ranging in the voltage axis from a $V_{SET\ START}$ of about 0.7V to about to a $V_{SET\ END}$ of about 0.8V, and a SET return I-V portion 156 from $V_{SET\ END}$ of about 1.5V to $V_{INIT}$ of about zero.

A RESET portion of the I-V curve 160 of FIG. 10 includes a RESET LRS I-V portion 158 ranging in the voltage axis from an a $V_{INIT}$ of about zero to $V_{RESET\ START}$ of about −1.3V, a RESET LRS-to-HRS transition I-V portion 160 ranging in the voltage axis from a $V_{RESET\ START}$ of about −1.3V to a $V_{RESET\ END}$ of about −1.5V, and a RESET return I-V portion 162 from $V_{RESET\ END}$ of about −1.5V to $V_{INIT}$ of about zero.

The I-V curve 150 FIG. 10 corresponding to an RRAM cells having 5 nm $Hf_zAl_yO_x$ demonstrate an ON/OFF ratios as measured by $V_{READ}$ at 0.3V of about 40.

It will be appreciated by those skilled in the art that various omissions, additions and modifications can be made to the processes described above without departing from the scope of the invention, and all such modifications and changes are intended to fall within the scope of the invention, as defined by the appended claims.

What is claimed is:

1. A method for forming a resistive random access memory (RRAM) device comprising:
    forming a first electrode;
    forming a resistive switching oxide layer comprising a metal oxide by thermal atomic layer deposition (ALD) at about 325° C. or less; and
    forming a second electrode by thermal atomic layer deposition (ALD),
    wherein the resistive switching layer is interposed between the first electrode and the second electrode.

2. The method of claim 1, wherein forming the resistive switching oxide is performed without exposing a surface of the switching oxide layer to a surface-modifying plasma treatment after depositing the metal oxide.

3. The method of claim 2, wherein forming the resistive switching oxide layer comprises depositing hafnium oxide.

4. The method of claim 3, wherein the hafnium oxide has the chemical formula $HfO_x$, wherein x is between about 1.5 and about 2.

5. The method of claim 4, wherein forming the resistive switching layer and forming the second electrode are performed at a temperature ranging between about 200° C. and about 300° C.

6. The method of claim 4, wherein forming the resistive switching oxide layer comprises depositing the $HfO_x$ at a temperature ranging between about 200° C. and about 250° C.

7. The method of claim 4, wherein forming the resistive switching oxide layer comprises depositing $HfO_x$ using precursors including $HfCl_4$ and $H_2O$.

8. The method of claim 6, wherein forming the first electrode and forming the second electrode include depositing a metal nitride.

9. The method of claim 8, wherein the first and second electrodes are in contact with the resistive switching oxide layer.

10. The method of claim 8, wherein depositing the metal nitride comprises depositing a TiN layer.

11. The method of claim 10, wherein forming the second electrode comprises depositing the TiN layer using precursors comprising $TiCl_4$ and $NH_3$.

12. The method of claim 11, wherein forming the second electrode layer comprises depositing the TiN layer at a temperature of about 400° C. or less.

13. The method of claim 12, wherein forming the second electrode layer comprises depositing the TiN layer at a temperature of between about 300° C. and about 350° C.

14. The method of claim 12 wherein forming the first electrode comprises depositing the TiN using precursors comprising $TiCl_4$ and $NH_3$.

15. The method of claim 1, wherein the RRAM device is a three-dimensional RRAM device comprising a plurality of first electrodes formed at different vertical levels and wherein the second electrode comprises a vertically-extending conductive rod.

16. The method of claim 15, wherein forming the first electrode includes:
depositing a first electrode layer over a substrate surface, the first electrode layers having a major surface substantially parallel to the substrate surface,
wherein forming the resistive switching layer comprises lining sidewall surfaces of a hole formed through the first electrode layer, the hole extending in the vertical direction, and
wherein forming the second electrode includes depositing a second electrode layer on the resistive switching layer.

17. The method of claim 16, wherein depositing the first electrode layer comprises depositing a conductive metal nitride.

18. The method of claim 16, wherein depositing the first electrode layer comprises depositing a sacrificial layer, and forming the first electrode further includes replacing the sacrificial layers with a conductive metal nitride.

19. The method of claim 15, wherein forming the first electrodes comprises:
depositing a sacrificial layer over a substrate surface, the sacrificial layer having a major surface substantially parallel to the substrate surface,
wherein forming the second electrode includes depositing the second electrode layer on sidewall surfaces of a hole formed through the sacrificial layer,
wherein forming the resistive switching layer comprises lining a cavity formed by removing the sacrificial layer, and
wherein forming the first electrodes further includes depositing the first electrode layer on the resistive switching layer.

20. The method of claim 15, further comprising forming transistors prior to forming the RRAM devices, the RRAM devices being formed over the transistors.

21. The method of claim 16, wherein the hole has a diameter in a range from about 20 nm to about 100 nm and a depth in a range from about 0.5 um to about 5 um.

22. A method for forming a resistive random access memory (RRAM) device comprising:
forming a first electrode comprising a metal nitride;
forming a resistive switching oxide layer comprising a metal oxide by atomic layer deposition (ALD) at about 325° C. or less; and
forming a second electrode comprising a metal nitride by thermal atomic layer deposition (ALD),
wherein the resistive switching layer has a first surface in contact with the first electrode and a second surface in contact with the second electrode, the first and second sides opposing each other.

23. The method of claim 22, wherein forming the resistive switching oxide is performed without exposing a surface of the switching oxide layer to a surface-modifying plasma treatment after depositing the metal oxide.

* * * * *

UNITED STATES PATENT AND TRADEMARK OFFICE
CERTIFICATE OF CORRECTION

PATENT NO. : 8,956,939 B2  
APPLICATION NO. : 13/872932  
DATED : February 17, 2015  
INVENTOR(S) : Qi Xie et al.

Page 1 of 1

It is certified that error appears in the above-identified patent and that said Letters Patent is hereby corrected as shown below:

On the title page (item 71, Applicant) at line 1, Change "ASM International N.V.," to --ASM IP Holding B.V.,--.

In the specification,

In column 1 at line 61, Change "embodiments" to --embodiments.--.

In column 14 at line 5, Change "FIRS" to --HRS--.

In column 14 at line 23, Change "FIRS" to --HRS--.

In column 15 at lines 62-63, Change "an a" to --a--.

In column 16 at line 3, Change "an a" to --a--.

In column 16 at lines 9-10, Change "an a" to --a--.

In column 16 at line 17, Change "an a" to --a--.

In column 16 at line 33, Change "3.8 V" to --3.8 V.--.

In column 16 at lines 35-36, Change "an a" to --a--.

In column 16 at line 43, Change "an a" to --a--.

Signed and Sealed this  
First Day of March, 2016

Michelle K. Lee  
*Director of the United States Patent and Trademark Office*